United States Patent
Sugimura et al.

[19]

[11] Patent Number: 6,114,732
[45] Date of Patent: Sep. 5, 2000

[54] FIELD EFFECT TRANSISTOR

[75] Inventors: Akihisa Sugimura, Settsu; Kunihiko Kanazawa, Muko, both of Japan

[73] Assignee: Matsushita Electronics Corporation, Osaka, Japan

[21] Appl. No.: 09/041,111

[22] Filed: Mar. 12, 1998

[30] Foreign Application Priority Data

Mar. 14, 1997 [JP] Japan .................................. 9-060334

[51] Int. Cl.[7] .......................... H01L 29/76; H01L 29/94; H01L 31/062; H01L 31/113; H01L 31/119
[52] U.S. Cl. .......................... 257/365; 257/369; 257/401; 438/199
[58] Field of Search .................................. 257/341, 365, 257/366, 369, 401; 438/199

[56] References Cited

U.S. PATENT DOCUMENTS

| | | | |
|---|---|---|---|
| 4,219,828 | 8/1980 | Lardy | 257/272 |
| 5,528,065 | 6/1996 | Battersby et al. | 257/365 |
| 5,652,452 | 7/1997 | Asano | 257/341 |
| 5,726,458 | 3/1998 | Bui | 257/48 |

FOREIGN PATENT DOCUMENTS

| | | |
|---|---|---|
| 54-87076 | 7/1979 | Japan . |
| 56-110257 | 9/1981 | Japan . |
| 57-109361 | 7/1982 | Japan . |
| 6-275658 | 9/1994 | Japan . |

*Primary Examiner*—David Hardy
*Assistant Examiner*—Allan R. Wilson
*Attorney, Agent, or Firm*—Michael K. Kelly; Snell & Wilmer, LLP

[57] ABSTRACT

A transistor includes a source region; a drain region; a channel region interposed between the source region and the drain region; and at least a first gate electrode and a second gate electrode provided on the channel region. At least one of the first and second gate electrodes traverses substantially an entire width of the channel region. At least another one of the first and second gate electrodes traverses a part of the width of the channel region.

6 Claims, 13 Drawing Sheets

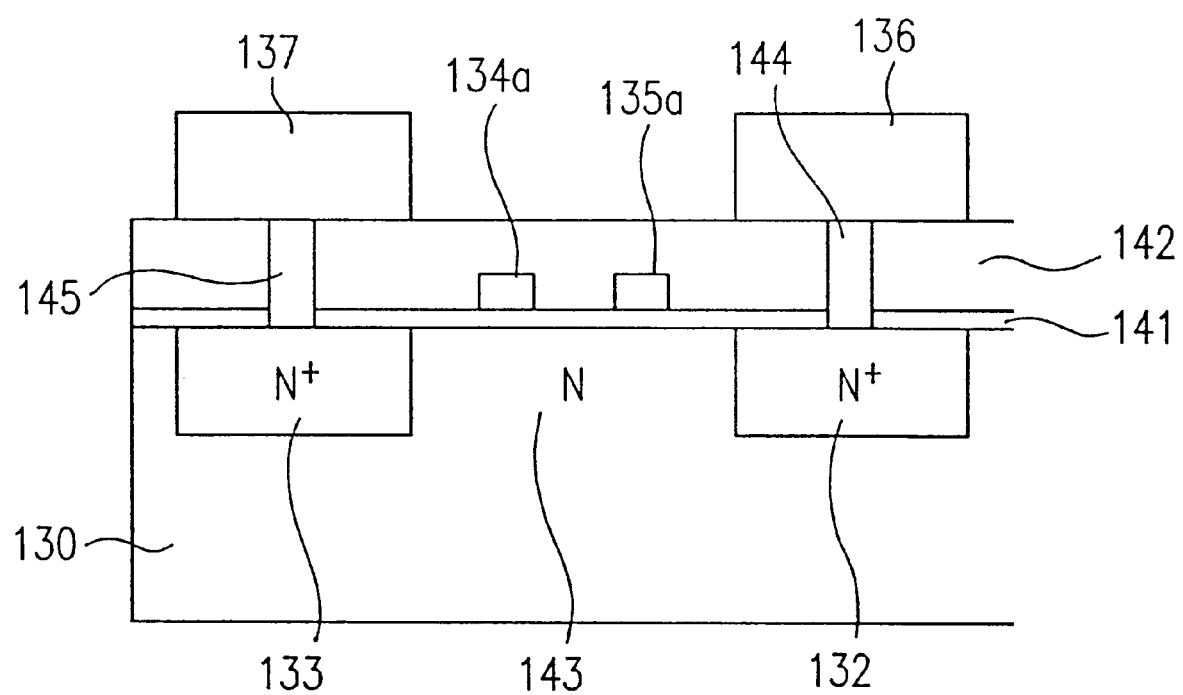

FIELD EFFECT TRANSISTOR

FIELD OF THE INVENTION

The present invention relates to a transistor such as a field effect transistor (FET) and a bipolar transistor, and a power amplifier including such a transistor.

DESCRIPTION OF THE RELATED ART

Conventionally, power amplifiers, in particular power amplifiers for amplifying high-frequency signals, often use a dual gate FET as an active device for reducing power consumption during low-power operation.

FIG. 13 is a block diagram of a conventional high-frequency power amplifier 100. The high-frequency power amplifier 100 shown in FIG. 13 includes a high-frequency power input terminal 1, a high-frequency power output terminal 2, an input impedance-matching circuit 3, an output impedance-matching circuit 4, a first gate voltage supply circuit 5, a second gate voltage supply circuit 6, a drain voltage supply circuit 7, a dual gate FET 8, variable negative power supplies 9 and 10, and a positive power supply 11. The variable negative power supply 9 supplies a bias voltage to the dual gate FET 8 via the first gate voltage supply circuit 5. The positive power supply 11 supplies a voltage to a drain of the dual gate FET 8 via the drain voltage supply circuit 7. Such drain is also coupled to the output terminal 2 via the output impedance-matching circuit 4 to be output.

An input signal is received at the high-frequency power input terminal 1, applied to a first gate of the dual gate FET 8 via the input impedance-matching circuit 3, and is amplified by the dual gate FET 8. The resultant signal is output from the high-frequency output terminal 2 via the output impedance-matching circuit 4.

The output voltage from the variable negative power supply 10 is adjusted so as to control a voltage applied to a second gate of the dual gate FET 8 by the variable negative power supply 10 via the second gate voltage supply circuit 6. Thus, the power consumption of the high-frequency power amplifier 100 during small signal operation is reduced.

The power consumption of the high-frequency power amplifier 100 during small signal operation is reduced by controlling the voltage applied to the second gate of the dual gate FET 8. However, the input impedance-matching circuit 3 and the output impedance-matching circuit 4 are electrically unmatched. This is because the input/output impedance of the dual gate FET 8 significantly changes as the voltage applied to the second gate changes. As a result of the unmatched input/output impedance, the input/output loss is increased and the input/output frequency characteristic is disturbed.

Accordingly, in the field of high-frequency power amplification, there is a demand for a FET in which the input/output impedance does not substantially change even when the voltage of the second gate is controlled in order to reduce the power consumption in small signal operation, and a power amplifier including such a FET.

SUMMARY OF THE INVENTION

According to one aspect of the invention, a transistor includes a source region; a drain region; a channel region interposed between the source region and the drain region; and at least a first gate electrode and a second gate electrode provided on the channel region. At least one of the first and second gate electrodes traverses substantially an entire width of the channel region. At least another one of the first and second gate electrodes traverses a part of the width of the channel region.

According to another aspect of the invention, a transistor includes a plurality of source regions and a plurality of drain regions alternately arranged with each other; a channel region interposed between a respective pair of the plurality of source regions and the plurality of drain regions; at least a first comb-shaped gate electrode and a second comb-shaped gate electrode having branches interdigitated with each other on the channel regions, a source electrode connected to the plurality of source regions; and a drain electrode connected to the plurality of drain regions. At least one of the first and second comb-shaped gate electrodes traverses an entire width of the channel regions. At least another one of the first and second comb-shaped gate electrodes traverses a part of the width of the channel regions.

According to still another aspect of the invention, a transistor includes a plurality of source regions and a plurality of drain regions alternately arranged with each other; a channel region interposed between a respective pair of the plurality of source regions and the plurality of drain regions; at least a first comb-shaped gate electrode and a second comb-shaped gate electrode having branches interdigitated with each other on the channel regions; a source electrode connected to the plurality of source regions; and a drain electrode connected to the plurality of drain regions. At least one of the first and second comb-shaped gate electrodes traverses an entire width of all the channel regions. At least another one of the first and second comb-shaped gate electrodes traverses an entire width of at least one of the channel regions.

According to still another aspect of the invention, a power amplifier includes one of the above-described transistors; an input terminal for receiving a signal; an output terminal for outputting the signal; an input impedance-matching circuit connected between the input terminal and the first gate electrode; an output impedance-matching circuit connected between a drain electrode of the transistor and the output terminal; a first DC voltage circuit connected to the first gate electrode; a second DC voltage circuit connected to the second gate electrode; and a third DC voltage circuit connected to the drain electrode.

In one embodiment of the invention, a power amplifier further includes a control circuit for controlling an output from the first DC voltage circuit and an output from the second DC voltage circuit.

According to still another aspect of the invention, a power amplifier system includes a plurality of the above-described power amplifiers.

According to still another aspect of the invention, a transistor includes a plurality of island regions each including a source region, a drain region, and a channel region; at least a first gate electrode, a second gate electrode and a third gate electrode provided on channel regions; a source electrode connected to the source regions; and a drain electrode connected to the drain regions. One of the first, second and third gate electrodes traverses an entire width of all the channel regions. The rest of the first, second and third gate electrodes traverse an entire width of the respective channel region.

According to still another aspect of the invention, a transistor includes a plurality of island regions each including a plurality of source regions, a plurality of drain regions, and a plurality of channel regions interposed between respective pairs of the plurality of source regions and the plurality of drain regions; at least a first comb-shaped gate electrode, a second comb-shaped gate electrode and a third comb-shaped gate electrodes having branches interdigitated with each other on the channel regions; a source electrode connected to the source regions; and a drain electrode connected to the drain regions. One of the first, second and third comb-shaped gate electrodes traverses an entire width of all the channel regions. The rest of the first, second and third comb-shaped gate electrodes traverse an entire width of the respective channel region.

According to still another aspect of the invention, a power amplifier including one of the above-described transistors; an input terminal for receiving a signal; an output terminal for outputting the signal; an input impedance-matching circuit connected between the input terminal and the first gate electrode; an output impedance-matching circuit connected between a drain electrode of the transistor and the output terminal; a first DC voltage circuit connected to the first gate electrode; a second DC voltage circuit connected to the second gate electrode; a third DC voltage circuit connected to the third gate electrode; and a fourth DC voltage circuit connected to the drain of the transistor.

In one embodiment of the invention, a power amplifier further includes a control circuit for controlling an output from the first DC voltage circuit, an output from the second DC voltage circuit, and an output from the third DC voltage circuit.

According to still another aspect of the invention, a power amplifier system includes a plurality of the above-described power amplifiers.

According to still another aspect of the invention, a transistor includes a source region; a drain region; a channel region disposed between the source region and the drain region; a first gate electrode and a second gate electrode which traverse a width of the channel region each to a different extent in order to selectively control an effective width of the channel region as a function of voltages applied to the first gate electrode and the second gate electrode.

Thus, the invention described herein makes possible the advantages of providing a FET for significantly reducing the power consumption for both large and small signal operation of an amplifier by maintaining the input/output impedance matched. The invention also makes possible the advantages of providing an amplifier including such a FET.

These and other advantages of the present invention will become apparent to those skilled in the art upon reading and understanding the following detailed description with reference to the accompanying figures.

BRIEF DESCRIPTION OF THE DRAWINGS

FIG. 3B is a cross-sectional view of the FET taken along line IIIB—IIIB of FIG. 3A;

DESCRIPTION OF THE PREFERRED EMBODIMENTS

Hereinafter, the present invention will be described by way of illustrative examples with reference to the accompanying drawings.

EXAMPLE 1

Figure 1:
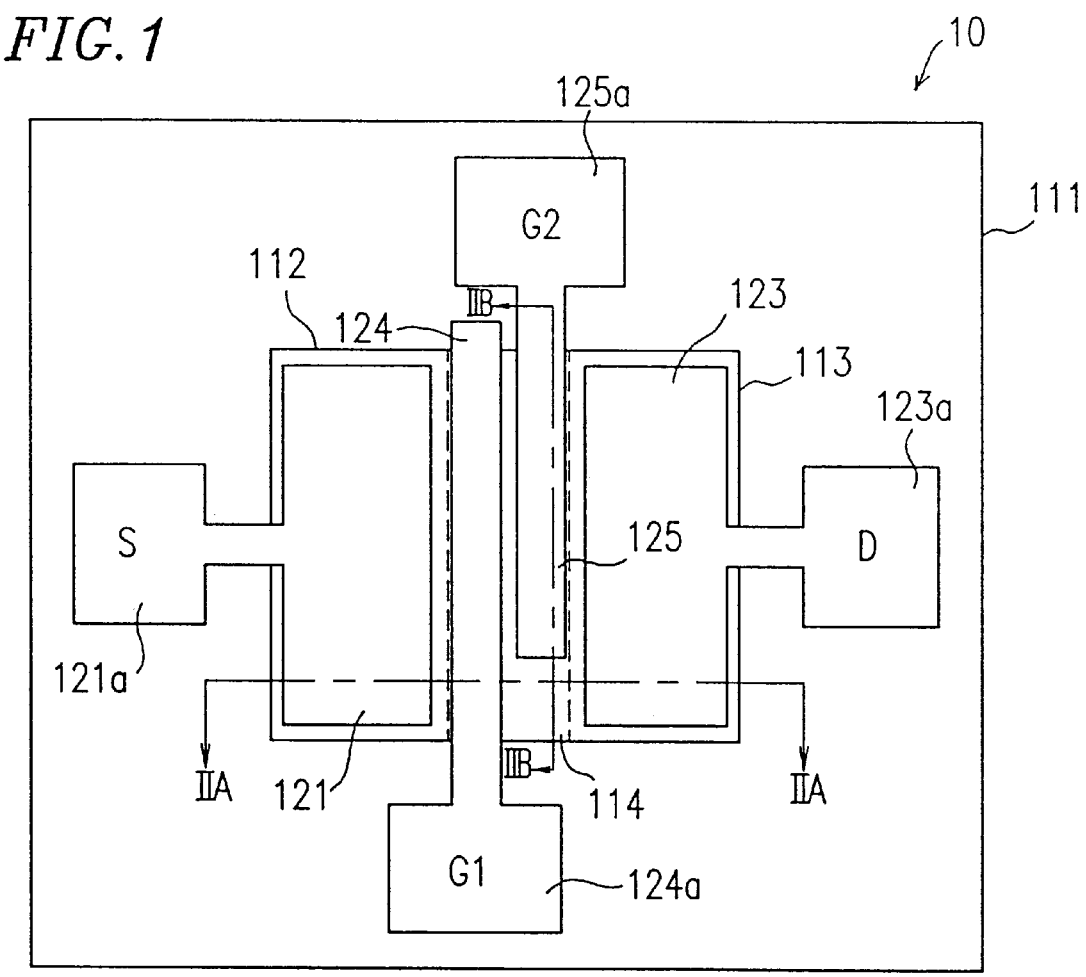
FIG. 1 is a plan view of a FET in a first example according to the present invention.
Figure 2A:
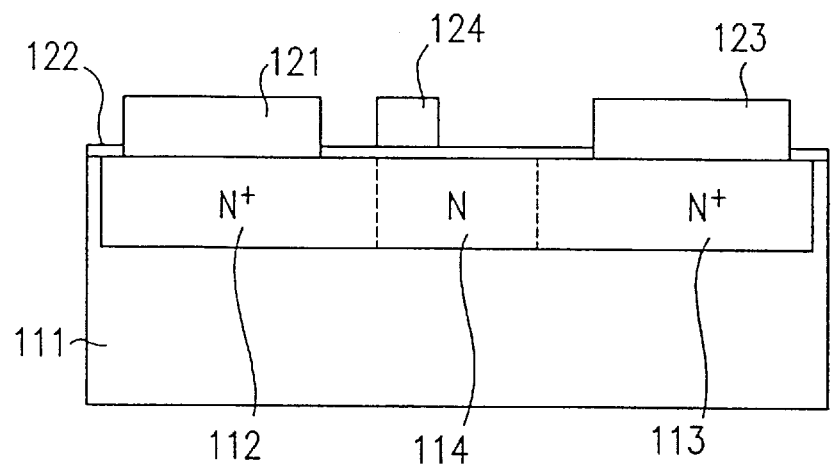
FIG. 2A is a cross-sectional view of the FET taken along line IIA—IIA of FIG. 1.
Figure 2B:
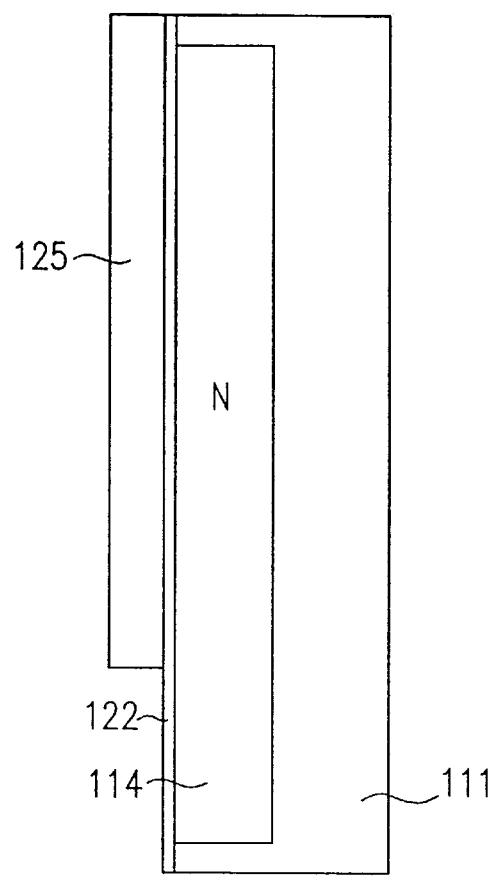
FIG. 2B is a cross-sectional view of the FET taken along line IIB—IIB of FIG. 1.

FIG. 1 is a plan view of a field effect transistor (hereinafter, referred to as a "FET") 10 in a first example according to the present invention. FIG. 2A is a cross-sectional view of the FET 10 taken along IIA—IIA of FIG. 1. FIG. 2B is a cross-sectional view of the FET 10 taken along line IIB—IIB of FIG. 1.

As shown in FIG. 1, the FET 10 includes an insulative semiconductor substrate 111, a source region 112, a drain region 113, and a channel region 114. As best shown in FIG. 2A, the source region 112 and the drain region 113 are both provided in a surface area of the insulative semiconductor substrate 111. The channel region 114 is interposed between the source region 112 and the drain region 113.

A source electrode 121 is provided on and in connection with the source region 112. A sub source electrode 121a (FIG. 1) is provided above the insulative semiconductor substrate 111 with an insulative film 122 interposed therebetween, and the sub source electrode 121a is connected to the source electrode 121.

A drain electrode 123 is provided on and in connection with the drain region 113. A sub drain electrode 123a (FIG. 1) is provided above the insulative semiconductor substrate 111 with the insulative film 122 interposed therebetween, and the sub drain electrode 123a is connected to the drain electrode 123.

A first gate electrode 124 and a second gate electrode 125 are provided on the insulative film 122 (FIGS. 2A and 2B). Returning to FIG. 1, the first and second gate electrodes 124 and 125 are parallel to each other and overlap the channel region 114. The first gate electrode 124 traverses the entire width of the channel region 114, and the second gate electrode 125 traverses a part of the width of the channel region 114. The first and second gate electrodes 124 and 125 respectively have sub gate electrodes 124a and 125a.

An edge of the first gate electrode 124 which is adjacent to the source region 112 runs parallel along an edge of the channel region 114. An edge of the second gate electrode 125 which is adjacent to the drain region 113 runs parallel along an edge of the channel region 114 but does not run along the entire width of the channel region 114.

The FET 10 operates as a dual gate FET when the first gate electrode 124 and the second gate electrode 125 are each supplied with a gate voltage for rendering the channel region 114 conductive.

The FET 10 operates as a single gate FET when the first gate electrode 124 is supplied with a gate voltage for rendering the channel region 114 conductive, and the second gate electrode 125 is supplied with a pinch-off voltage. The second gate electrode 125 exists only on a part of the channel region 114. The pinch-off voltage is supplied only to such a part of the channel region 114. Accordingly, the source region 112 and the drain region 113 are isolated from each other partially.

As can be appreciated from the above, the FET 10 has the functions of two types of FETs.

In the above-described structure, the FET 10 has only one dual gate. In a structure where two or more second gate electrodes traversing a part of the width of the channel region 114 are provided in lieu of the second electrode 125, the FET has a function of a single gate FET and also functions of two or more types of dual gate FETs.

EXAMPLE 2

Figure 3A:
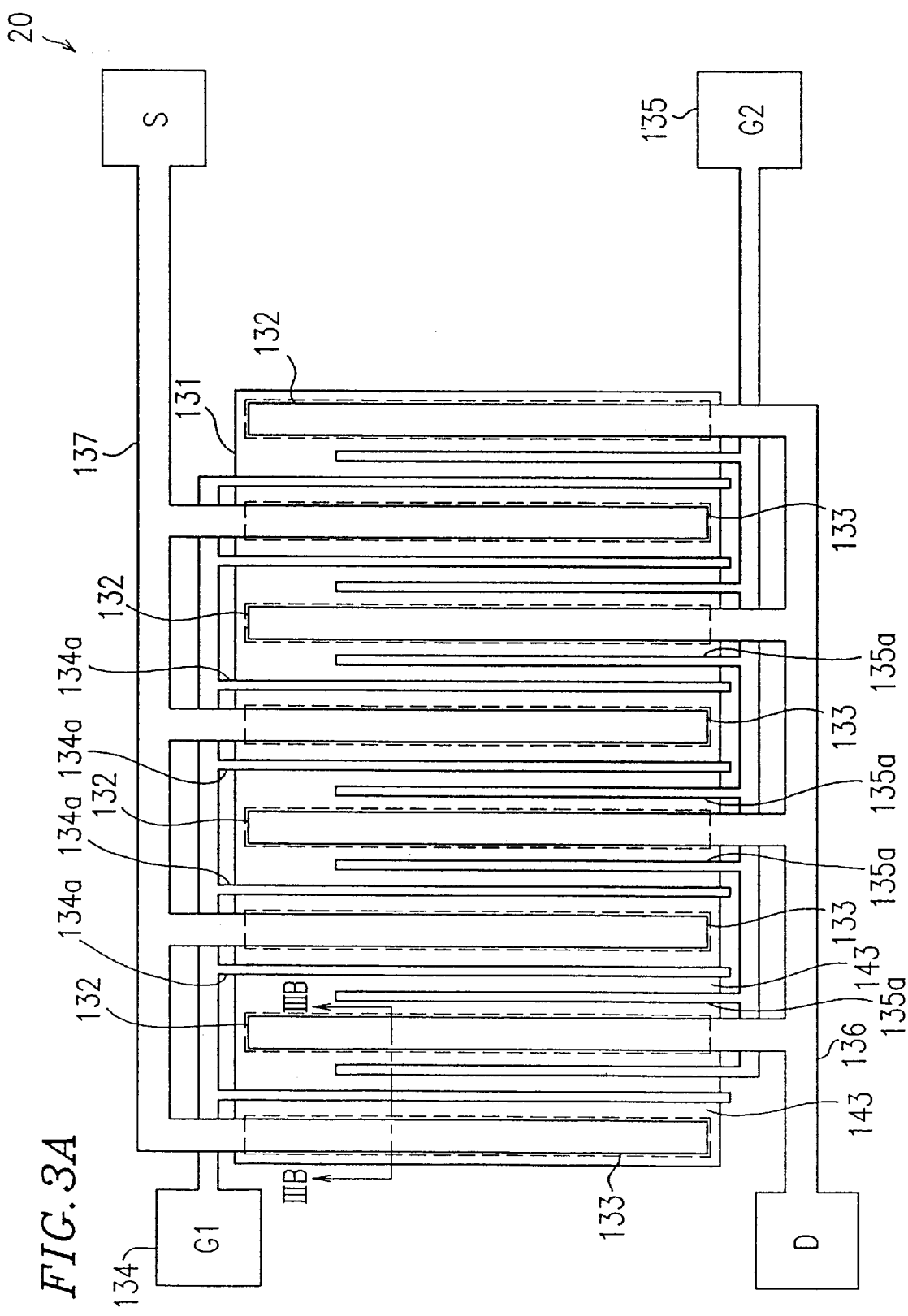
FIG. 3A is a plan view of a FET in a second example according to the present invention.

FIG. 3A is a plan view of a FET 20 in a second example according to the present invention. FIG. 3B is a cross-sectional view of the FET 20 taken along line IIIB—IIIB in FIG. 3A.

The FET 20 includes an insulative semiconductor substrate 130 (FIG. 3B) and an active region 131 (FIG. 3A) provided in a surface area of the insulative semiconductor substrate 130. The active region 131 includes a plurality of drain regions 132 and a plurality of source regions 133 arranged alternately. On a first insulative film 141 (FIG. 3B) which is provided on the insulative semiconductor substrate 130, first and second gate comb-shaped electrodes 134 and 135 (FIG. 3A). The comb-shaped electrodes 134 and 135 each have a plurality of branches 134a and 135a which are provided on the channel regions 143 and interdigitated with each other. On the first and second gate electrodes 134 and 135, a second insulative film 142 (FIG. 3B) is provided. On the second insulative film 142, a drain electrode 136 and a source electrode 137 interdigitated with each other are provided.

The drain electrode 136 is connected to each of the plurality of drain regions 132 via a plurality of holes 144 formed through the first and second insulative films 141 and 142. The source electrode 137 is connected to each of the plurality of source regions 133 via a plurality of holes 145 formed through the first and second insulative films 141 and 142.

The plurality of branches 134a each traverse the entire width of a channel region 143 between a respective pair of adjacent branches of the source electrode 137 and the drain electrode 136. The plurality of branches 135a each traverse a part of the width of the channel region 143 between a respective pair of adjacent branches of the source electrode 137 and the drain electrode 136.

In such a structure also, as in the first example, the FET 20 operates as a dual gate FET when the first gate electrode 134 and the second gate electrode 135 are each supplied with a gate voltage for rendering the channel regions 143 conductive.

The FET 20 operates as a single gate FET when the first gate electrode 134 is supplied with a gate voltage for rendering the channel regions 143 conductive, and the second gate electrode 135 is supplied with a pinch-off voltage for isolating the source regions 133 and the drain regions 132 from each other partially.

The FET 20 in this example is optimum for power amplification of high-frequency signals because of the interdigitated structure thereof.

In the above-described structure, the FET 20 has a&only one dual gate. In a structure where two or more second gate electrodes traversing a part of the width of the channel region 143 are provided in lieu of the second electrode 135, the FET has a function of a single gate FET and also functions of two or more types of dual gate FETs.

EXAMPLE 3

Figure 4:
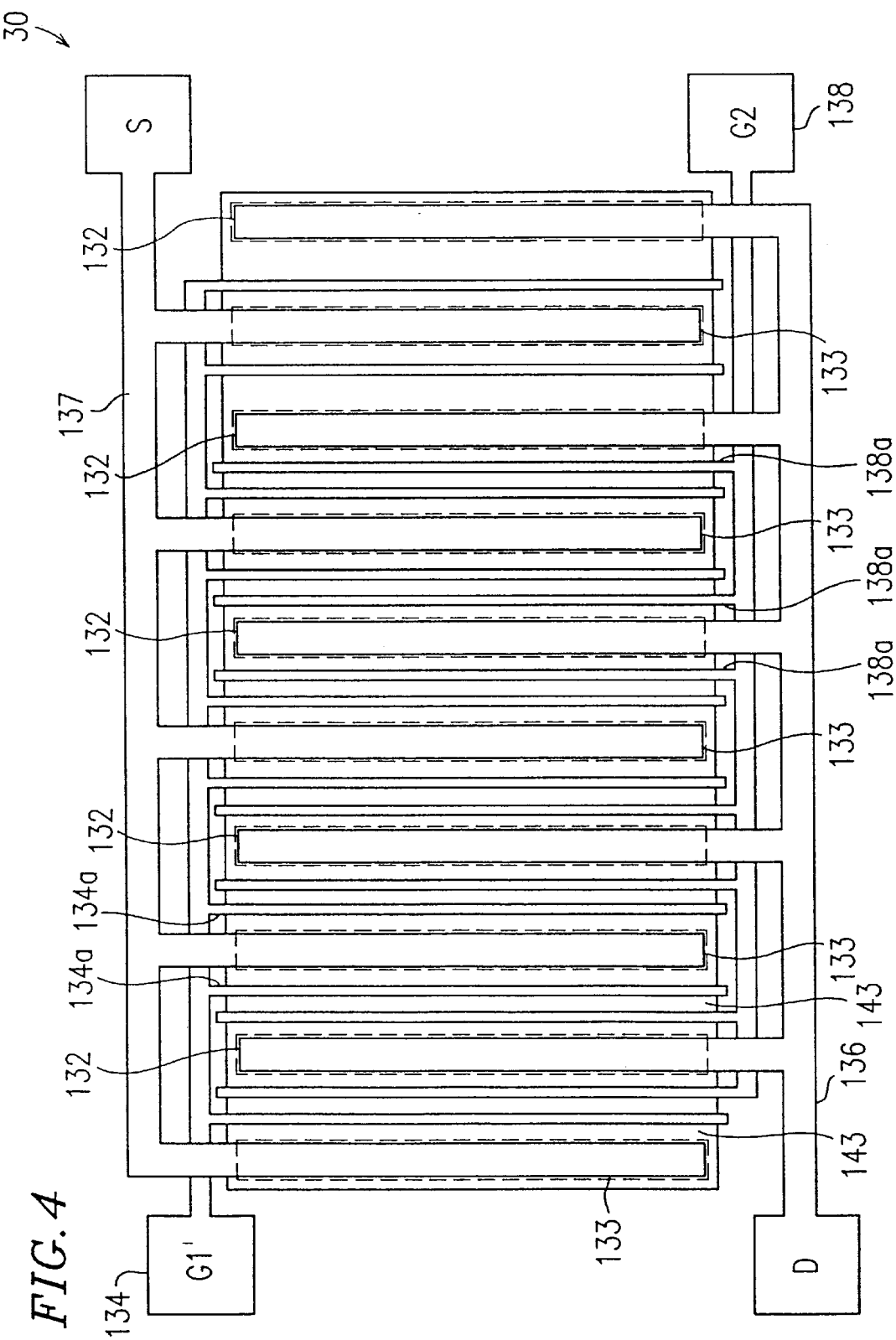
FIG. 4 is a plan view of a FET in a third example according to the present invention.

FIG. 4 is a plan view of a FET 30 in a third example according to the present invention. Identical elements previously discussed with respect to FIGS. 3A and 3B bear identical reference numerals and the descriptions thereof will be omitted.

The FET 30 includes a second comb-shaped gate electrode 138 in lieu of the second gate electrode 135. The comb-shaped second gate electrode 138 has a plurality of branches 138a which each traverse the entire width of the channel region 143. The number of the branches 138a of the second electrode 138 is smaller than the number of the branches 134a of the first electrode 134. Thus, for example, the branches 138a do not exist between the first drain region 132 and the first source region 133 from the right in FIG. 4, or between the second drain region 132 and the first source region 133 from the right in FIG. 4.

In such a structure also, the FET 30 operates as a dual gate FET when the first gate electrode 134 and the second gate electrode 138 are each supplied with a gate voltage for rendering the channel regions 143 conductive.

The FET 30 operates as a single gate FET when the first gate electrode 134 is supplied with a gate voltage for rendering the channel regions 143 conductive, and the second gate electrode 138 is supplied with a pinch-off voltage for isolating the source regions 133 and the drain regions 132 from each other partially. When gate voltages are applied in such a manner, the channel regions 143 between the source region 133 and the drain region 132 where the branches 134a and 138a both exist become non-conductive. Only the channel regions 143 where the branches 134a exist in the absence of branches 138a, i.e., the channel regions 143 between the first drain region 132 and the first source region 131 from the right in FIG. 3 and between the second drain region 132 and the first source region 133 from the right in FIG. 4, become conductive. Thus, the FET 30 operates as a single gate FET.

The FET 30 in this example is optimum for power amplification of high-frequency signals because of the interdigitated structure thereof.

The channel regions 143 between the source region 133 and the drain region 132 where no branch 138a exits can be provided in an arbitrary number and at arbitrary positions.

In the above-described structure, the FET 30 has only one dual gate. In a structure where two or more second gate electrodes traversing the entire width of the channel region 143 are provided in lieu of the second electrode 138, with or without branches being partially missed, the FET has a function of a single gate FET and also functions of two or more types of dual gate FETs.

Alternatively, the second electrode 135 in the second example can be provided in addition to the second electrode 138.

EXAMPLE 4

Figure 5:
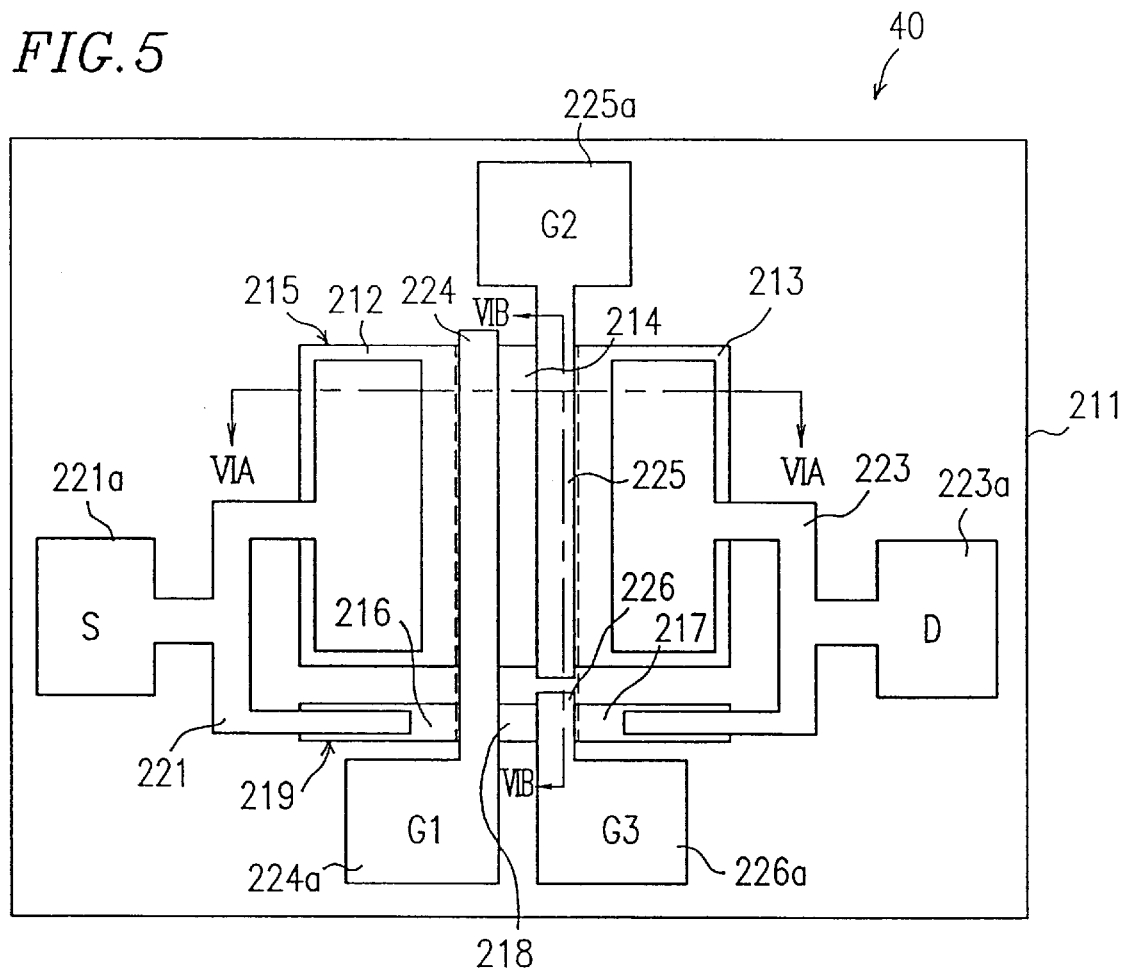
FIG. 5 is a plan view of a FET in a fourth example according to the present invention.
Figure 6A:
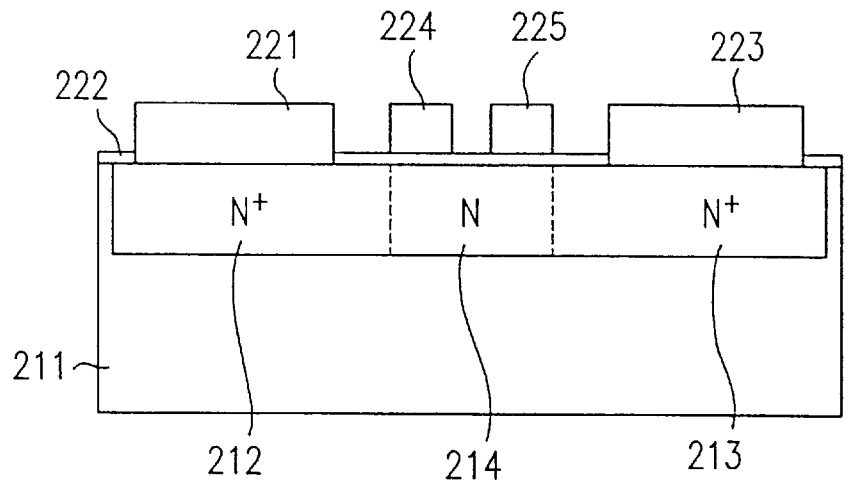
FIG. 6A is a cross-sectional view of the FET taken along VIA—VIA of FIG. 5.
Figure 6B:
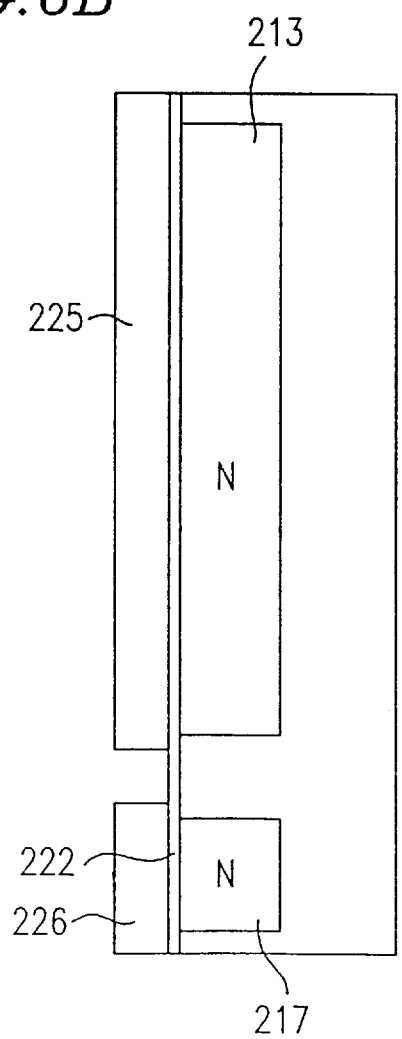
FIG. 6B is a cross-sectional view of the FET taken along line VIB—VIB of FIG. 5.

FIG. 5 is a plan view of a field effect transistor 40 in a fourth example according to the present invention. FIG. 6A is a cross-sectional view of the FET 40 taken along line VIA—VIA of FIG. 5. FIG. 6B is a cross-sectional view of the FET 40 taken along line VIB—VIB of FIG. 5.

As shown in FIG. 5, the FET 40 includes an insulative semiconductor substrate 211; a first island region 215 having a first source region 212, a first drain region 213, and a first channel region 214; and a second island region 219 having a second source region 216, a second drain region 217, and a second channel region 218. The first island region 215 and the second island region 219 are both provided in a surface area of the insulative semiconductor substrate 211.

As best shown in FIG. 6A, a source electrode 221 has two parts, which are respectively provided on and in connection with the first source region 212 and the second source region 216. A sub source electrode 221a (FIG. 5) is provided above the insulative semiconductor substrate 211 with an insulative film 222 interposed therebetween, and the sub source electrode 221a is connected to the source electrode 221.

A drain electrode 223 has two parts, which are respectively provided on and in connection with the first drain region 213 and the second drain region 217 (FIG. 6B). A sub drain electrode 223a (FIG. 5) is provided above the insulative semiconductor substrate 211 with the insulative film 222 interposed therebetween, and the sub drain electrode 223a is connected to the drain electrode 223.

A first gate electrode 224 is provided on the insulative film 222 on the insulative semiconductor substrate 211. A second gate electrode 225 and a third gate electrode 226 are provided parallel to the first gate electrode 224. Returning to FIG. 5, the first gate electrode 224 traverses the entire width of the first and second channel regions 214 and 218. The second gate electrode 225 traverses the entire width of the first channel region 214. The third gate electrode 226 traverses the entire width of the second channel region 218. The first, second and third gate electrodes 224, 225 and 226 respectively have sub gate electrodes 224a, 225a and 226a.

An edge of the first gate electrode 224 which is adjacent to the first source region 212 runs parallel along edges of the first and second channel regions 214 and 218. An edge of the first gate electrode 224 which is adjacent to the second source region 216 runs parallel along edges of the first and second channel regions 214 and 218. Similarly, edges of the second gate electrode 225 which are adjacent to the first drain region 213 run parallel along edges of the first channel region 214. Edges of the third gate electrode 226 which are adjacent to the second drain region 217 run parallel along edges of the second channel region 218.

The FET 40 has three FET functions having different sized dual gates as described below although having a structure of one FET where the source electrode, the drain electrode and at least one gate electrode which is operative in all the channel regions.

The FET 40 operates as a FET having a first dual gate when the first gate electrode 224 and the second gate electrode 225 are each supplied with a gate voltage for rendering the first channel regions 214 conductive, and the first gate electrode 224 and the third gate electrode 226 are each supplied with a gate voltage for rendering the second channel regions 218 conductive.

The FET 40 operates as a FET having a second dual gate when the first gate electrode 224 and the second gate electrode 225 are each supplied with a gate voltage for rendering the first channel regions 214 conductive, and the third gate electrode 226 is supplied with a pinch-off voltage for isolating the second source regions 216 and the second drain regions 217 from each other partially.

The FET 40 operates as a FET having a third dual gate when the first gate electrode 224 and the third gate electrode 226 are each supplied with a gate voltage for rendering the channel regions 218 conductive, and the second gate electrode 225 is supplied with a pinch-off voltage for isolating the first source regions 212 and the first drain regions 213 from each other partially.

In the above-described structure, the FET 40 has two island regions 215 and 219 each having a source region, a drain region and a channel region. In a structure where three or more island regions are provided as well as a gate electrode traversing the entire width of all the channel regions and a plurality of gate electrodes respectively traversing the entire width of the respective channel regions, the FET can have function as four or more types of dual gate FETs.

EXAMPLE 5

Figure 7:
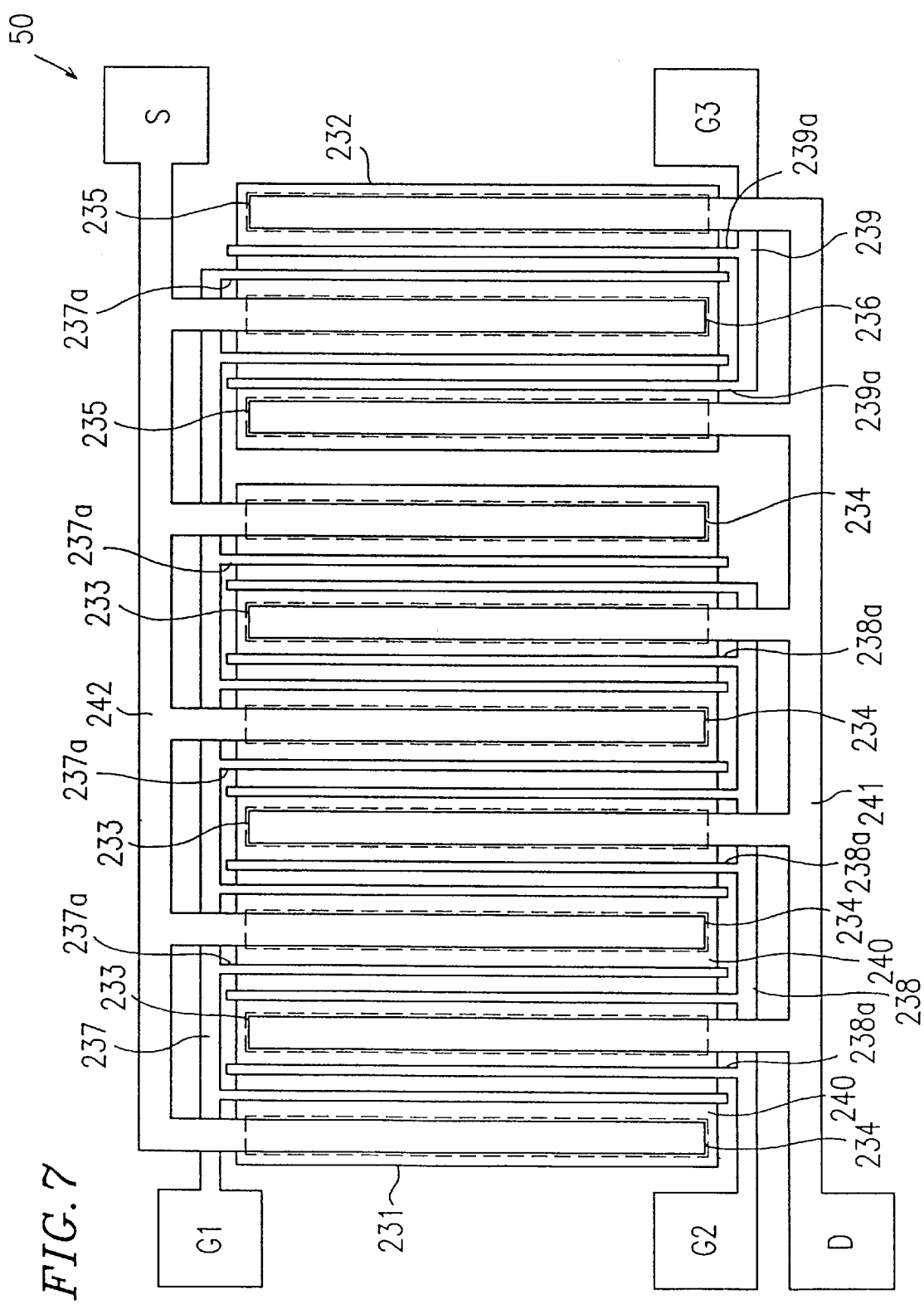
FIG. 7 is a plan view of a FET in a fifth example according to the present invention.

FIG. 7 is a plan view of a FET 50 in a fifth example according to the present invention. The FET 50 includes an insulative semiconductor substrate (not shown), and a first island region 231 and a second island region 232 which are provided in a surface area of the insulative semiconductor substrate. The first island region 231 includes a plurality of drain regions 233 and a plurality of source regions 234 arranged alternately. The second island region 232 includes a plurality of drain regions 235 and a plurality of source regions 236 arranged alternately. On a first insulative film (not shown) which is provided on the insulative semiconductor substrate, first, second and third comb-shaped gate electrodes 237, and 238 and 239, respectively, are provided. The first, second and third comb-shaped gate electrodes 237, and 238 and 239 respectively have a plurality of branches 237a, 238a and 239a. The branches 237a, 238a and 239a are interdigitated with each other with respect to the first island region 231, and also with respect to the second island region 232. On the first, second and third gate electrodes 237, 238 and 239, a second insulative film (not shown) is provided. On the second insulative film, a drain electrode 241 and a source electrode 242 interdigitated with each other are provided.

The drain electrode 241 is connected to each of the plurality of the first drain regions 233 and each of the plurality of second drain regions 235 via a plurality of holes in the first and second insulative films. The source electrode 242 is connected to each of the plurality of source regions 234 and each of the plurality of source regions 236 via a plurality of holes in the first and second insulative films.

The first gate electrode 237 has a plurality of branches 237a which each traverse the entire width of a channel region 240 between a respective pair of adjacent branches of the source electrode 242 and the drain electrode 241 on both the first island region 231 and the second island region 232. The second gate electrode 238 has a plurality of branches 238a which each traverse the entire 30 width of the channel region 240 between a respective pair of adjacent branches of the source electrode 242 and the drain electrode 241 on the first island region 231. The third gate electrode 239 has a plurality of branches 239a which each traverse the entire width of the channel region 240 between a respective pair of adjacent branches of the source electrode 242 and the drain electrode 241 on the second island region 232.

The FET 50 has three FET functions having different sized dual gates as described below although having a structure of one FET where the source electrode, the drain electrode and at least one gate electrode which is operative in all the channel regions.

The FET 50 operates as a FET having a first dual gate when the first gate electrode 237 and the second gate electrode 238 are each supplied with a gate voltage for rendering the channel regions 240 conductive, and the first gate electrode 237 and the third gate electrode 239 are each supplied with a gate voltage for rendering the channel regions 240 conductive.

The FET 50 operates as a FET having a second dual gate when the first gate electrode 237 and the second gate electrode 238 are each supplied with a gate voltage for rendering the channel regions 240 conductive, and the third gate electrode 239 is supplied with a pinch-off voltage for isolating the second source regions 236 and the corresponding second drain regions 235 from each other partially.

The FET 50 operates as a FET having a third dual gate when the first gate electrode 237 and the third gate electrode 239 are each supplied with a gate voltage for rendering the channel regions 240 conductive, and the second gate electrode 238 is supplied with a pinch-off voltage for isolating the first source regions 234 and the corresponding first drain regions 233 from each other partially.

The FET 50 in this example is optimum for power amplification of high-frequency signals because of the interdigitated structure thereof.

In the above-described structure, the FET 50 has two island regions 231 and 232 each having a plurality of source regions and a plurality of drain regions. In a structure where three or more island regions are provided as well as a gate electrode traversing the entire width of all the channel regions between the source and drain regions and a plurality of gate electrodes traversing the entire width of the respective channel region, the FET can function as four or more types of dual gate FETs.

The structures of the first through fifth example can be appropriately combined.

The FET according to the present invention can be formed including a semiconductor substrate informed of any possible material.

In each of the first through fifth examples, a MOSFET including the gate electrodes above the semiconductor substrate with an oxide film interposed therebetween is described. The present invention is applicable to a transistor including gate electrodes provided directly on a GaAs substrate. In this case, an oxide film is eliminated, although the plan view of the transistor is the same as that of the MOSFET.

EXAMPLE 6

Figure 8:
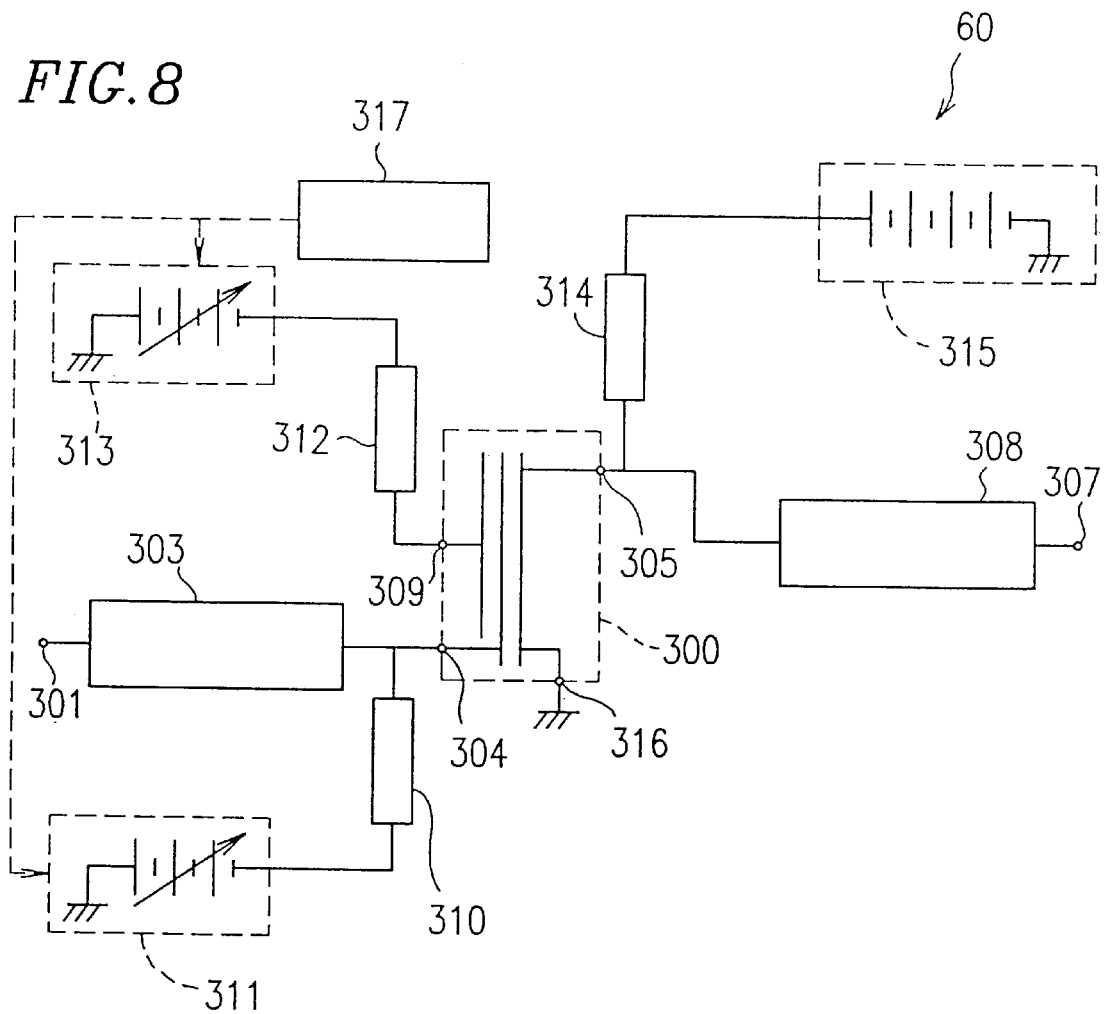
FIG. 8 is a block diagram of a high-frequency power amplifier in a sixth example including a FET in the first, second or third example.

FIG. 8 is a block diagram of a high-frequency power amplifier (hereinafter, referred to as the "amplifier" for simplicity) 60 in a sixth example according to the present invention. The amplifier 60 includes a FET described in any of the first, second and third examples. The FET is represented by reference numeral 300 in FIG. 8. The FET 300 has a first gate terminal 304 connected to the first gate electrode (not shown), a second gate terminal 309 connected to the second gate electrode (not shown), a drain terminal 305 connected to the drain electrode (not shown), and a source terminal 316 connected to the source electrode (not shown).

The amplifier 60 includes the FET 300, a high-frequency power input terminal 301, an input impedance-matching circuit 303 connected between the high-frequency power input terminal 301 and the first gate terminal 304 of the FET 300, a high-frequency power output terminal 307, and an output impedance-matching terminal 308 connected between the high-frequency power output terminal 307 and the drain terminal 305. The amplifier 60 further includes a first gate voltage supply circuit 310 and a first variable negative power supply 311 which are connected in series between the first gate terminal 304 and ground, a second gate voltage supply circuit 312 and a second variable negative power supply 313 which are connected in series between the second gate terminal 309 and ground, and a drain voltage supply circuit 314 and a positive power supply 315 which are connected in series between the drain terminal 305 and ground. The source terminal 316 is grounded.

The first gate voltage supply circuit 310 and the first variable negative power supply 311 are included in a series voltage power circuit. The second gate voltage supply circuit 312 and the second variable negative power supply 313 are included in a series voltage power circuit. The drain voltage supply circuit 314 and the positive power supply 315 are included in a series voltage power circuit.

The amplifier 60 further includes a microprocessor 317 for controlling outputs from the first and second variable negative power supplies 311 and 313.

The amplifier 60 operates in large signal operation when voltage Vgg1 is applied to the first gate terminal 304, voltage Vgg2 is applied to the second gate terminal 309, and voltage Vdd is applied to the drain terminal 305. Voltages Vgg1 and Vgg2 are both in the range of the voltage for rendering the channel region between the source region and the drain region of the FET 300 conductive as described in connection with the first, second and third examples.

Figure 9:
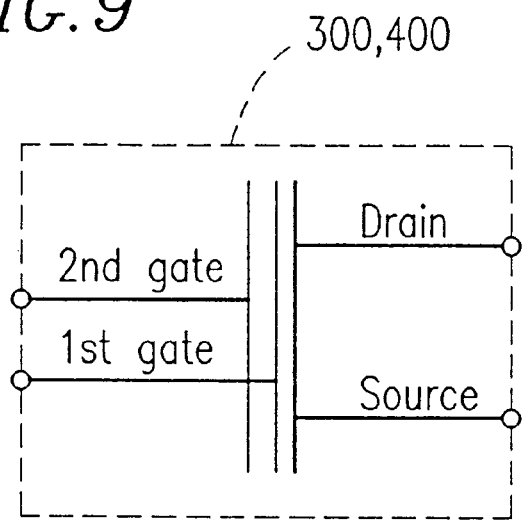
FIG. 9 is an equivalent circuit diagram of the FET for operating within the high-frequency power amplifier shown in FIG. 8 during large signal operation.

FIG. 9 is an equivalent circuit diagram of the FET 300 for operating the amplifier 60 in large signal operation. As shown in FIG. 9, the FET 300 operates both as a dual gate FET having a large gate width and a single gate FET having a smaller gate width operate in parallel. Such an operation of the FET 300 is approximate to the operation of a general dual gate FET acting as an active device.

The amplifier 60 operates in small signal operation when voltage Vgg1 is applied to the first gate terminal 304, voltage Vgg3 is applied to the second gate terminal 309, and voltage Vdd is applied to the drain terminal 305. Voltages Vgg1 and Vgg2 are both in the range of the voltage for rendering the channel region between the source region and the drain region of the FET 300 conductive. Voltage Vgg3 is a pinch-off voltage for isolating the source region and the drain region of the FET 300 from each other partially as described in connection with the first, second and third examples.

Figure 10:
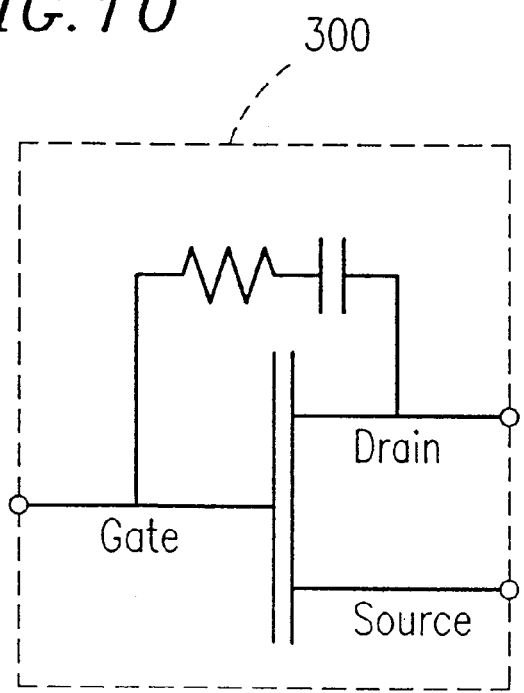
FIG. 10 is an equivalent circuit diagram of the FET for operating within the high-frequency power amplifier shown in FIG. 8 during small signal operation.

FIG. 10 is an equivalent circuit diagram of the FET 300 for operating the amplifier 60 in small signal operation. As shown in FIG. 10, the FET 300 has a single gate FET portion used as an active device and a dual gate FET portion used as a feedback circuit. Such an operation of the amplifier 60 is approximate to the operation of an amplifier which has a general single gate FET used as an active device and has a feedback circuit.

In general, the input/output impedance of a FET is approximately inversely proportional to the gate width. With respect to the same gate width, the input/output impedance of a dual gate FET is significantly large than the input/output impedance of a single gate FET.

The input/output impedance is reduced by applying feedback to the FET.

In this example, when the amplifier 60 operates in large signal operation, the impedance is satisfactorily small due to the operation of the FET 300 as a dual gate FET having a large gate width. When the amplifier 60 operates in small signal operation, the impedance which tends to be increased by the single gate FET having a smaller gate width is reduced by the feedback function provided by the dual gate FET. Accordingly, the difference in the input/output impedance between in the large signal operation and in the small signal operation is significantly reduced when compared with the case where the conventional dual gate FET is used.

In the FET 300, the gate width of the second gate electrode is set to be smaller than the gate width of the first gate electrode.

For example, where the ratio between the gate width formed between the drain region and the source region when the FET operates as a dual gate FET and such a gate width when the FET operates as a single gate FET is 9:1, the power consumption of the single gate FET in small signal operation is 1/10 of the power consumption of the dual gate FET in large signal operation.

The use of the microprocessor 317 adds another advantage that the power consumption is further reduced by appropriately adjusting the voltage to be applied to the first gate terminal 304 for the small signal operation.

As can be appreciated from the above description, the amplifier 60 realizes significant reduction in the power consumption in small signal operation without substantially changing the input/output impedance, which is significantly advantageous.

In this example, the FET in any one of the first, second and third examples can be used. In the case where a FET having functions of two or more dual gate FETs is used, the power consumption is more precisely controlled by changing the effective gate width of the FET to be used in accordance with the output power.

A multiple stage amplifier including a plurality of amplifiers 60 connected in series has a larger gain.

EXAMPLE 7

Figure 11:
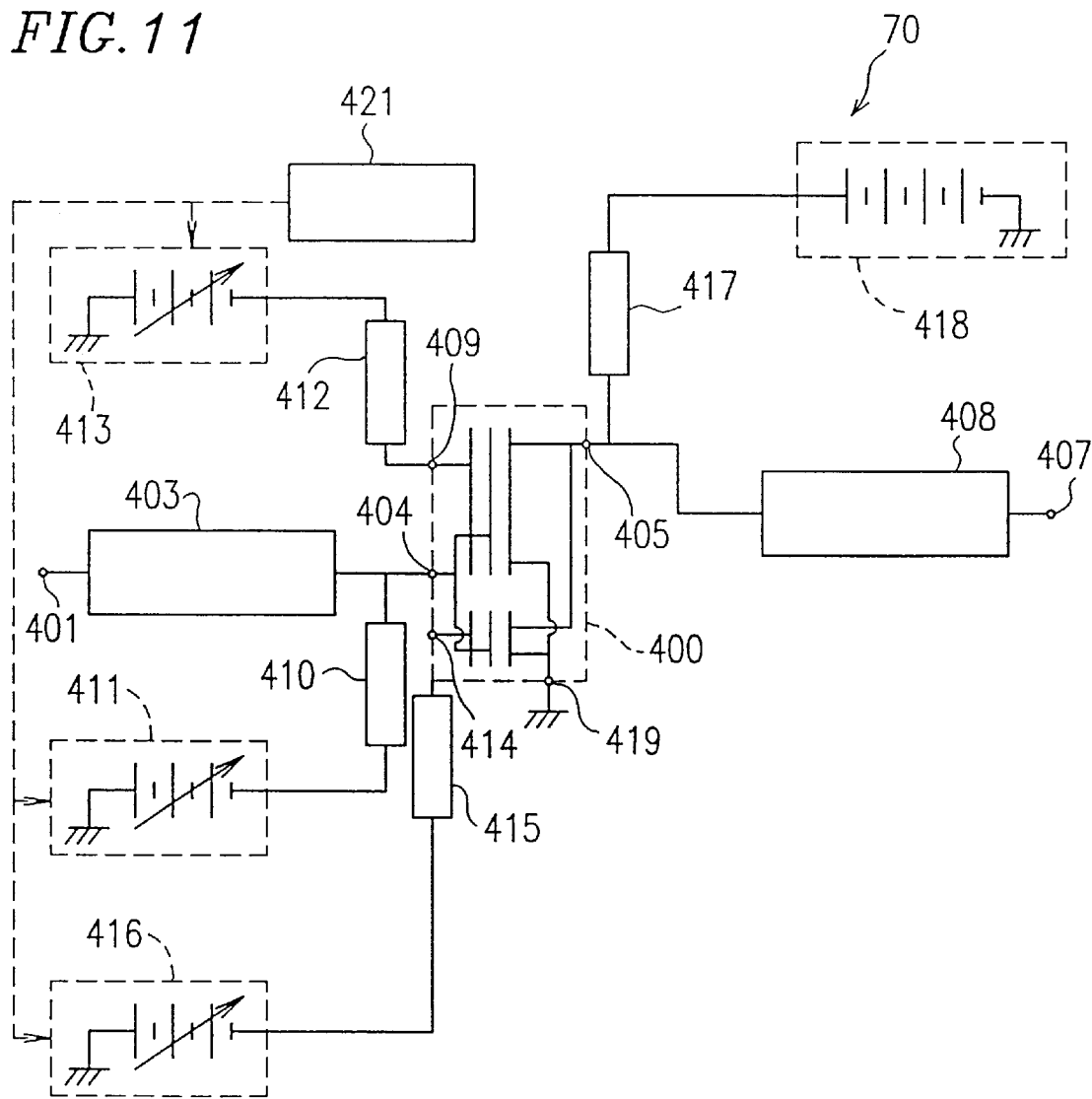
FIG. 11 is a block diagram of a high-frequency power amplifier in a seventh example including a FET in the fourth or fifth example.

FIG. 11 is a block diagram of a high-frequency power amplifier 70 in a seventh example according to the present invention. The amplifier 70 includes a FET described in the fourth or fifth example. The FET is represented by reference numeral 400 in FIG. 11. The FET 400 has a first gate terminal 404 connected to the first gate electrode (not shown), a second gate terminal 409 connected to the second gate electrode (not shown), a third gate terminal 414 connected to the third gate electrode (not shown), a drain terminal 405 connected to the drain electrode (not shown), and a source terminal 419 connected to the source electrode (not shown).

The amplifier 70 includes the FET 400, a high-frequency power input terminal 401, an input impedance-matching circuit 403 connected between the high-frequency power input terminal 401 and the first gate terminal 404 of the FET 400, a high-frequency power output terminal 407, and an output impedance-matching terminal 408 connected between the high-frequency power output terminal 407 and the drain terminal 405. The amplifier 70 further includes a first gate voltage supply circuit 410 and a first variable negative power supply 411 which are connected in series between the first gate terminal 404 and the ground, a second gate voltage supply circuit 412 and a second variable negative power supply 413 which are connected in series between the second gate terminal 409 and the ground, a third gate voltage supply circuit 415 and a third variable negative power supply 416 which are connected in series between the third gate terminal 414 and the ground, and a drain voltage supply circuit 417 and a positive power supply 418 which are connected in series between the drain terminal 405 and the ground. The source terminal 419 are grounded.

The first gate voltage supply circuit 410 and the first variable negative power supply 411 are included in a series voltage power circuit. The second gate voltage supply circuit 412 and the second variable negative power supply 413 are included in a series voltage power circuit. The third gate voltage supply circuit 415 and the third variable negative power supply 416 are included in a series voltage power circuit. The drain voltage supply circuit 417 and the positive power supply 418 are included in a series voltage power circuit.

The amplifier 70 still further includes a microprocessor 421 for controlling outputs from the first, second and third variable negative power supplies 411, 413 and 416.

In the FET 400, the gate width of the third gate electrode is set to be slightly smaller than the gate width of the first gate electrode and the gate width of the second gate electrode.

The amplifier 70 operates in large signal operation when voltage Vgg1 is applied to the first gate terminal 404, voltage Vgg2 is applied to each of the second gate terminal 409 and the third gate terminal 414, and voltage Vdd is applied to the drain terminal 405. Voltage Vgg1 is in the range of the voltage for rendering the channel region between the first source region and the first drain region of the FET 400 conductive, and voltage Vgg2 is in the range of the voltage for rendering the channel region between the second source region and the second drain region of the FET 400 conductive as described in connection with the fourth and fifth examples.

As described in the sixth example with reference to FIG. 9, the FET 400 also operates both as a dual gate FET having a large gate width and a single gate FET having a smaller gate width operate in parallel. Such an operation of the FET 400 is approximate to the operation of a general dual gate FET acting as an active device.

The amplifier 70 operates in small signal operation when voltage Vgg1 is applied to the first gate terminal 404, voltage Vgg2 is applied to the third gate terminal 414, and voltage Vgg3 is applied to the second gate terminal 409, and voltage Vdd is applied to the drain terminal 405. Voltages Vgg1 and Vgg2 are both in the range of the voltage for rendering the channel region between the respective source region and the respective drain region conductive. Voltage Vgg3 is a pinchoff voltage for isolating the source region and the drain region from each other partially as described in connection with the first, second and third examples.

Figure 12:
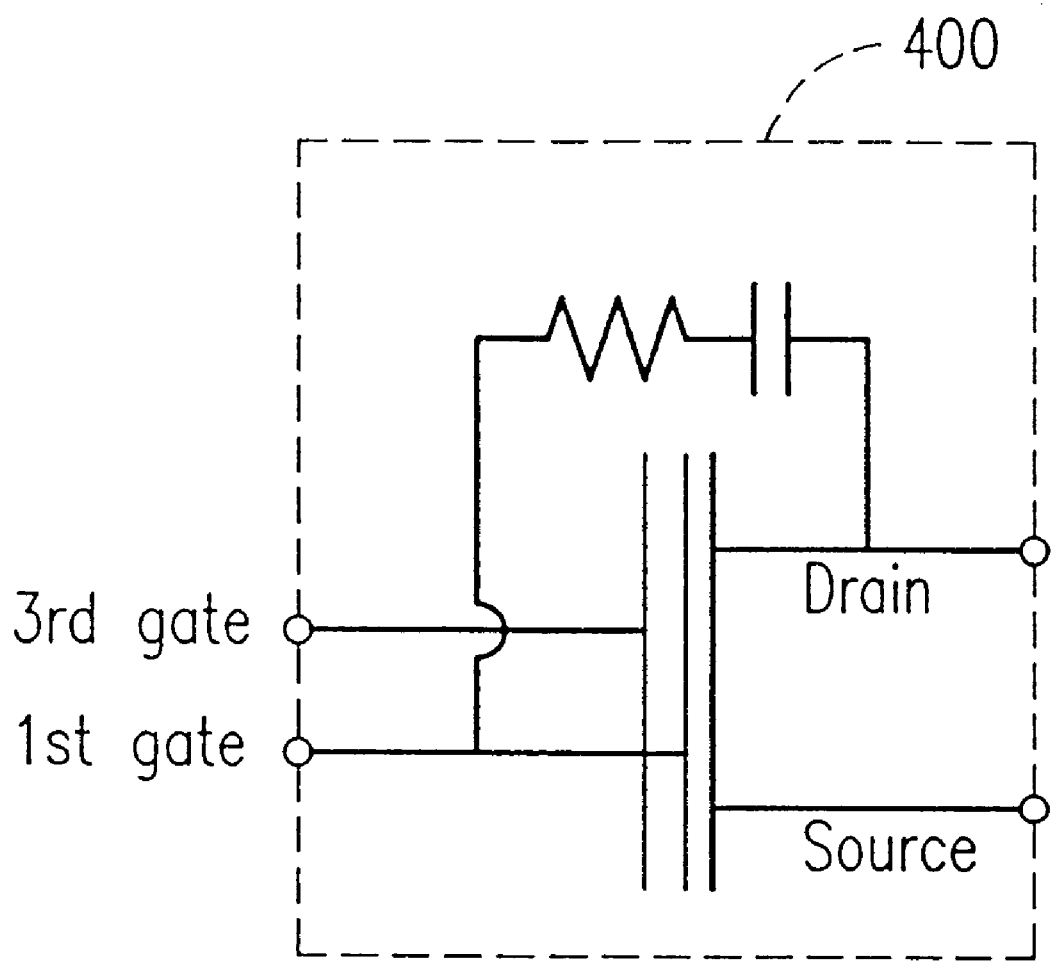
FIG. 12 is an equivalent circuit diagram of the FET for operating the high-frequency power amplifier shown in FIG. 11 during small signal operation.
Figure 13:
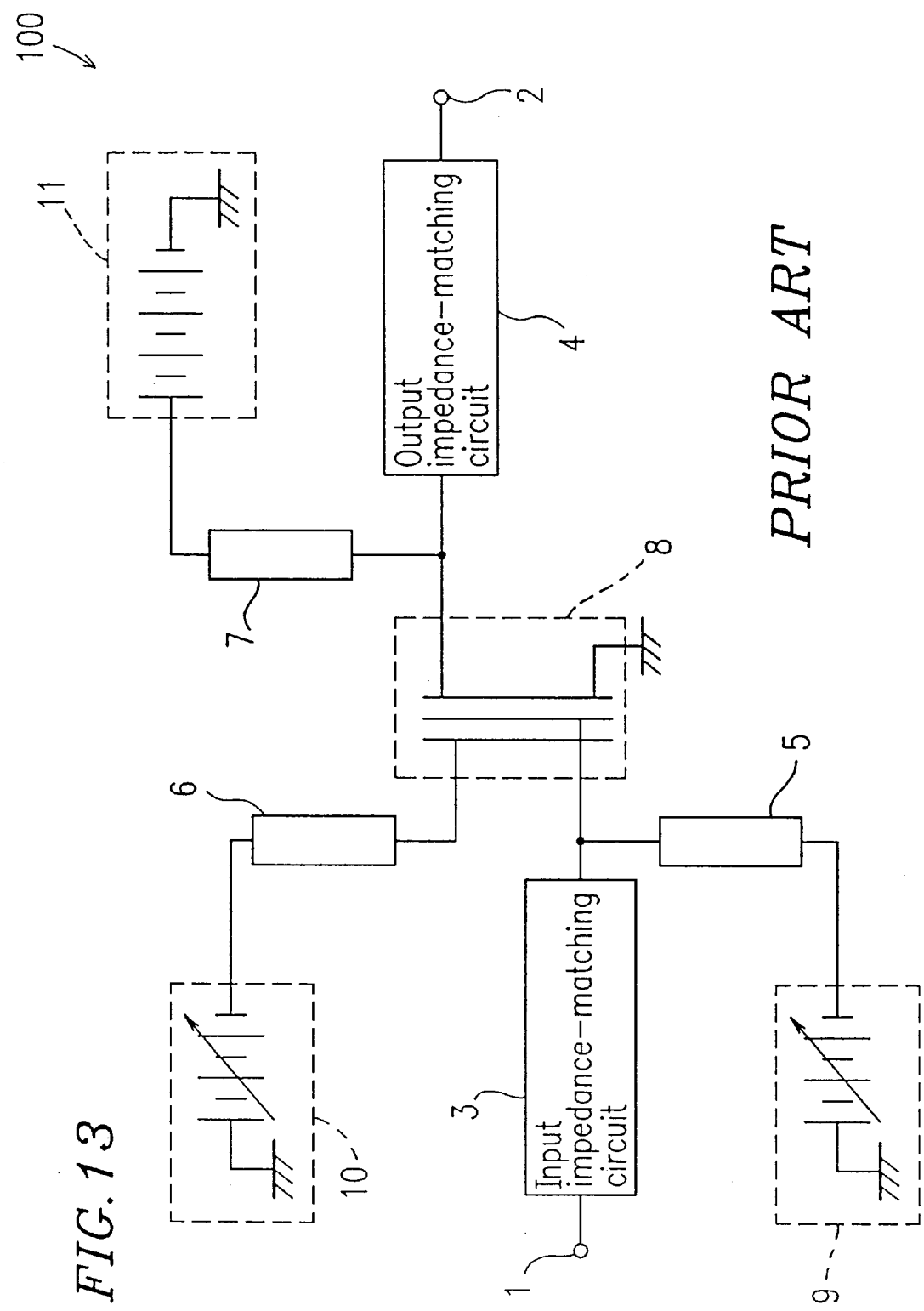
FIG. 13 is a block diagram of a conventional high-frequency power amplifier.

FIG. 12 is an equivalent circuit diagram of the FET 400 for operating the amplifier 70 in small signal operation. As shown in FIG. 12, the FET 400 have a dual gate FET portion having a smaller gate width formed in a second island region which is used as an active device and a dual gate FET portion having a larger gate width formed in a first island region which is used as a feedback circuit. Such an operation of the amplifier 70 is approximate to the operation of an amplifier which has a general single gate FET used as an active device and has a feedback circuit.

In general, the input/output impedance of a FET is approximately in inverse proportion to the gate width as described above. The input/output impedance is reduced by applying feedback to the FET.

In this example, when the amplifier 70 operates in large signal operation, the impedance is satisfactorily small due to the operation of the FET 400 as a dual gate FET having a large gate width. When the amplifier 70 operates in small signal operation, the impedance which tends to be increased by the dual gate FET having a smaller gate width is reduced by the feedback function provided by the dual gate FET having a larger gate width. Accordingly, the difference in the input/output impedance between in the large signal operation and in the small signal operation is significantly reduced when compared with the case where the conventional dual gate FET is used.

For example, where the ratio between the gate width of the second gate electrode and the gate width of the third gate electrode is 9:1, the power consumption of the FET in small signal operation is 1/10 of the power consumption of the FET in large signal operation.

The use of the microprocessor 412 adds another advantage that the power consumption is further reduced by appropriately adjusting the voltage to be applied to the first gate terminal 404 for the small signal operation.

As can be appreciated from the above description, the amplifier 70 realizes significant reduction in the power consumption in small signal operation without substantially changing the input/output impedance, which is significantly advantageous.

In this example, the FET in the fourth or fifth example can be used. In the case where a FET having a plurality of types of dual gates formed in three or more island regions is used, the power consumption is more precisely controlled by changing the effective gate width of the FET function to be used in accordance with the output power.

A multiple stage amplifier including a plurality of amplifiers 70 connected in series has a larger gain.

According to the present invention, the power consumption is significantly reduced for both large signal operation and small signal operation by maintaining the input/output impedance.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A transistor, comprising:
    a source region;
    a drain region;
    a channel region interposed between the source region and the drain region; and
    at least a first gate electrode and a second gate electrode provided on the channel region, wherein:
        at least one of the first and second gate electrodes traverses substantially an entire width of the channel region, and
        at least another one of the first and second gate electrodes traverses a part of the width of the channel region, said part being less than the entire width of the channel region.

2. A transistor, comprising:
    a plurality of source regions and a plurality of drain regions alternately arranged with each other;
    a channel region interposed between a respective pair of the plurality of source regions and the plurality of drain regions;
    at least a first comb-shaped gate electrode and a second comb-shaped gate electrode having branches interdigitated with each other on the channel regions;
    a source electrode connected to the plurality of source regions; and
    a drain electrode connected to the plurality of drain regions, wherein:
        at least one of the first and second comb-shaped gate electrodes traverses substantially an entire width of the channel regions, and
        at least another one of the first and second comb-shaped gate electrodes traverses a part of the width of the channel regions, said part being less than the entire width of the channel regions.

3. A transistor, wherein
    a plurality of source regions and a plurality of drain regions alternately arranged with each other;
    a channel region interposed between a respective pair of the plurality of source regions and the plurality of drain regions;
    at least a first comb-shaped gate electrode and a second comb-shaped gate electrode having branches interdigitated with each other on the channel regions;
    a source electrode connected to the plurality of source regions; and
    a drain electrode connected to the plurality of drain regions, wherein:
        at least one of the first and second comb-shaped gate electrodes traverses an entire width of all the channel regions,
        at least another one of the first and second comb-shaped gate electrodes traverses an entire width of at least one, but fewer than all, of the channel regions.

4. A transistor, comprising:
    a plurality of island regions each including a source region, a drain region, and a channel region;
    at least a first gate electrode, a second gate electrode and a third gate electrode;
    a source electrode connected to the source regions; and
    a drain electrode connected to the drain regions, wherein:
        one of the first, second, and third gate electrodes traverses an entire width of all the channel regions, and
        the remaining of the first, second, and third gate electrodes traverse an entire width of the respective channel region.

5. A transistor comprising:
    a plurality of island regions each including a plurality of source regions, a plurality of drain regions, and a plurality of channel regions interposed between respective pairs of the plurality of source regions and the plurality of drain regions;
    at least a first comb-shaped gate electrode, a second comb-shaped gate electrode, and a third comb-shaped gate electrode having branches interdigitated with each other on the channel regions;

a source electrode connected to the source regions; and a drain electrode connected to the drain regions, wherein:

one of the first, second, and third comb-shaped gate electrodes traverses an entire width of all the channel regions, and the remaining of the first, second, and third comb-shaped gate electrodes traverse an entire width of the respective channel region.

6. A transistor, comprising:

a source region;

a drain region;

a channel region disposed between the source region and the drain region;

a first gate electrode and a second gate electrode which traverse a width of the channel region each to a different extent in order to selectively control an effective width of the channel region as a function of voltages applied to the first gate electrode and the second gate electrode.

* * * * *